(12) United States Patent
Shaeffer et al.

(10) Patent No.: US 10,228,249 B2
(45) Date of Patent: Mar. 12, 2019

(54) DUTY-CYCLED GYROSCOPE

(71) Applicant: InvenSense, Inc., San Jose, CA (US)

(72) Inventors: Derek Shaeffer, Redwood City, CA (US); Stanley Wang, Cupertino, CA (US)

(73) Assignee: InvenSense, Inc., San Jose, CA (US)

( * ) Notice: Subject to any disclaimer, the term of this patent is extended or adjusted under 35 U.S.C. 154(b) by 125 days.

(21) Appl. No.: 15/282,227

(22) Filed: Sep. 30, 2016

(65) Prior Publication Data

US 2017/0016723 A1    Jan. 19, 2017

Related U.S. Application Data

(62) Division of application No. 14/088,059, filed on Nov. 22, 2013, now Pat. No. 9,506,757.

(Continued)

(51) Int. Cl.
*G01C 19/00* (2013.01)
*G01P 3/44* (2006.01)
(Continued)

(52) U.S. Cl.
CPC ......... *G01C 19/10* (2013.01); *G01C 19/5776* (2013.01); *H03G 3/20* (2013.01);
(Continued)

(58) Field of Classification Search
CPC .. G01C 19/10; G01C 19/5776; G01C 19/065; H03L 7/099; H03L 7/093; H03L 7/0891; H03G 3/20; Y10T 74/1229
(Continued)

(56) References Cited

U.S. PATENT DOCUMENTS

2004/0008800 A1    1/2004 White
2005/0030108 A1    2/2005 Duncan et al.
(Continued)

FOREIGN PATENT DOCUMENTS

CN    202153136 U    2/2012
CN    102803897 A    11/2012
(Continued)

OTHER PUBLICATIONS

EP Extended Search Report dated Nov. 29, 2016 in EP Application No. 14775783.5. 9 pages.
(Continued)

*Primary Examiner* — Richard Tan

(57) ABSTRACT

A gyroscope system comprises a MEMS gyroscope coupled to a drive system and a sense system. The drive system maintains the MEMS gyroscope in a state of oscillation and the sense system for receiving, amplifying, and demodulating an output signal of the MEMS gyroscope that is indicative of the rate of rotation. The gyroscope system further includes a phase-locked look (PLL) which receives a reference clock (REFCLK) from the drive system and produces a system clock (CLK). Finally, the gyroscope system includes a controller operating on the system clock sets an operating state of the drive system and the sense system and also controls a state of the PLL. One or more system state variables are maintained in a substantially fixed state during a protect mode thereby enabling rapid transitions between a low-power mode and a normal operating mode of the gyroscope system.

19 Claims, 5 Drawing Sheets

Related U.S. Application Data

(60) Provisional application No. 61/783,858, filed on Mar. 14, 2013.

(51) Int. Cl.
| | | |
|---|---|---|
| *G01P 15/08* | (2006.01) | |
| *G01C 19/10* | (2006.01) | |
| *G01C 19/5776* | (2012.01) | |
| *H03G 3/20* | (2006.01) | |
| *H03L 7/089* | (2006.01) | |
| *H03L 7/093* | (2006.01) | |
| *H03L 7/099* | (2006.01) | |
| *G01C 19/06* | (2006.01) | |

(52) U.S. Cl.
CPC ............ *H03L 7/0891* (2013.01); *H03L 7/093* (2013.01); *H03L 7/099* (2013.01); *G01C 19/065* (2013.01); *Y10T 74/1229* (2015.01)

(58) Field of Classification Search
USPC .............................................. 73/504, 504.08
See application file for complete search history.

(56) References Cited

U.S. PATENT DOCUMENTS

| | | | |
|---|---|---|---|
| 2008/0234935 A1* | 9/2008 | Wolf | G01C 21/16 701/472 |
| 2010/0117700 A1 | 5/2010 | Raghunathan et al. | |
| 2011/0121907 A1* | 5/2011 | Kanai | G01C 19/56 331/65 |
| 2011/0179868 A1 | 7/2011 | Kaino et al. | |
| 2011/0254760 A1 | 10/2011 | Lloyd et al. | |
| 2013/0099836 A1 | 4/2013 | Shaeffer et al. | |

FOREIGN PATENT DOCUMENTS

| | | |
|---|---|---|
| CN | 102893127 A | 1/2013 |
| CN | 102947673 A | 2/2013 |
| CN | 102564411 A | 7/2017 |

OTHER PUBLICATIONS

PCT International Search Report and Written Opinion dated Jun. 10, 2014 in PCT Application No. PCT/US2014/019665.

PCT International Preliminary Report on Patentability dated Sep. 24, 2015 in PCT Application No. PCT/US2014/019665. 13 pages.

* cited by examiner

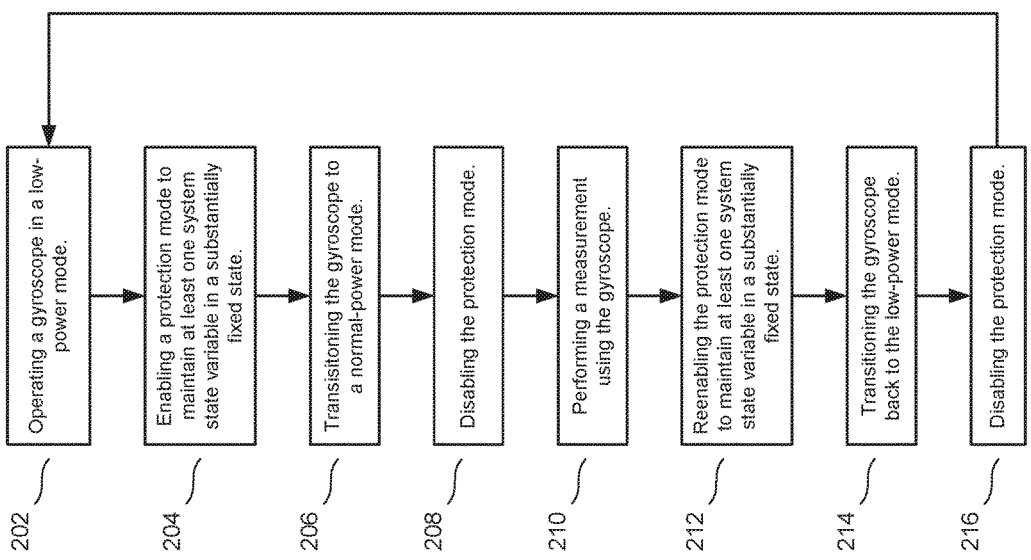

DUTY-CYCLED GYROSCOPE

CROSS-REFERENCE TO RELATED APPLICATION

This application is a divisional application and claims benefit and priority to the U.S. patent application Ser. No. 14/088,059, which claims the benefit and priority to U.S. Provisional Patent Application No. 61/783,858, filed on Mar. 14, 2013, entitled "DUTY-CYCLED GYROSCOPE," which are incorporated herein by reference in their entirety.

FIELD OF THE INVENTION

The present invention is related generally to gyroscopes and more particularly to duty cycled gyroscopes.

BACKGROUND

It is generally of interest to minimize power consumption in gyroscope systems to enhance their use in portable, battery-powered device applications. One method known in the art for saving power consumption is to duty-cycle a system. In a duty-cycled system, the system is initially in a low-power operating mode. Periodically, it transitions to a normal operating mode, makes a measurement and then returns to the low-power operating mode.

A difficulty in duty-cycling a gyroscope system stems from the fact that certain system state variables are very slow to respond to changes in system state. For example, the amplitude of oscillation of the gyroscope (as regulated by the AGC loop) cannot change rapidly due to the high quality factor of the MEMS oscillation. The phase-locked loop may also have relatively low bandwidth, meaning that it will be slow to respond to any disturbance affecting its VCO tuning voltage.

However, it is desirable to transition the system quickly between low-power and normal operating modes to minimize the overhead associated with mode transitions and to thereby maximize the output data rate that can be maintained while duty-cycling. The present invention addresses such a need.

SUMMARY

A gyroscope system is disclosed. The gyroscope system comprises a MEMS gyroscope coupled to a drive system and a sense system. The drive system maintains the MEMS gyroscope in a state of oscillation and the sense system receives, amplifies and demodulates an output signal of the MEMS gyroscope that is indicative of the rate of rotation. The gyroscope system further includes a phase-locked look (PLL) which receives a reference clock (REFCLK) from the drive system and produces a system clock (CLK). Finally, the gyroscope system includes a controller operating on the system clock sets an operating state of the drive system and the sense system and also controls a state of the PLL. One or more system state variables are maintained in a substantially fixed state during a protect mode thereby enabling rapid transitions between a low-power mode and a normal operating mode of the gyroscope system.

BRIEF DESCRIPTION OF THE DRAWINGS

FIG. 2 is a flow chart of a method in accordance with an embodiment.

DETAILED DESCRIPTION

The present invention is related generally to gyroscopes and more particularly to duty cycled gyroscopes. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Figure 1:
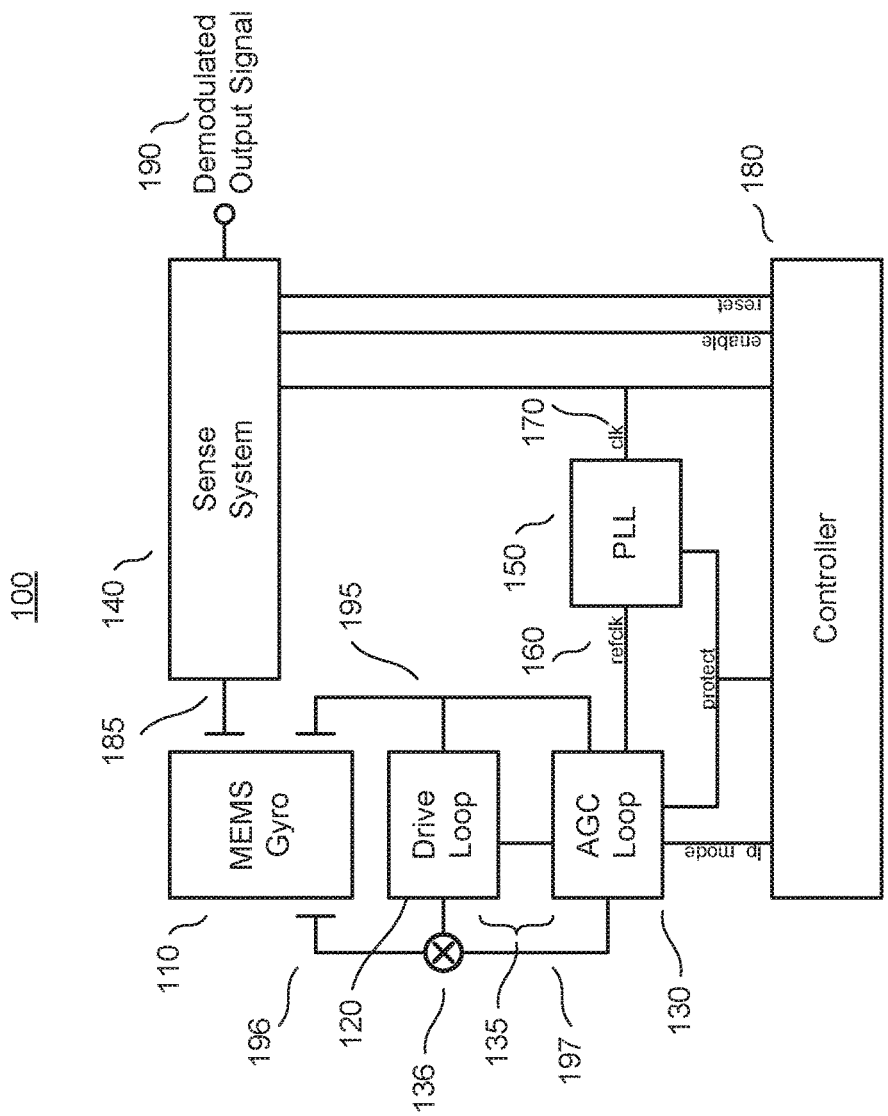
FIG. 1 illustrates a block diagram of a MEMS gyroscope system.

FIG. 1 illustrates a block diagram of a MEMS gyroscope system 100. In the system 100, a MEMS gyroscope 110 is coupled to two systems: a drive system 135 comprising a drive loop 120 and an AGC loop 130, whose function is to maintain the MEMS gyroscope 110 in a state of oscillation; and a sense system 140 receiving, amplifying and demodulating an output signal 185 of the MEMS gyroscope 110 to produce a demodulated output signal 190 that is indicative of a rate of rotation. The MEMS drive loop 120 receives a drive-sense signal 195 from the MEMS and closes a feedback loop around the MEMS gyro 110 by providing a drive signal 196. By closing the feedback loop, the MEMS drive loop 120 causes the MEMS gyroscope 110 to oscillate. The AGC loop 130 receives the drive-sense signal 195 and monitors its amplitude of oscillation. To set the amplitude of the drive-sense signal 195 to a desired level, the AGC loop 130 provides a gain control output 197 to adjust the amplitude of the drive signal 196 by multiplication 136. A phase-locked look (PLL) 150 receives a reference clock (REFCLK) 160 from the MEMS drive system 135 and produces a system clock (CLK) 170. A controller 180 operating on the system clock 170 sets the operating state of the two systems 135 and 140 and also controls the state of the PLL 150. According to various embodiments, the demodulated output signal 190 may be analog or digital. In a digital MEMS gyroscope embodiment, the sense system 140 also receives the system clock 170 and performs A/D conversion to produce the demodulated output signal 190.

In a system and method in accordance with an embodiment, an intermediate mode—also referred to as a protect mode—is introduced in which the slow system state variables are preserved during the transitions between low-power to normal operating modes. Examples of slow system state variables may include a gain control output of the AGC loop which controls the drive loop gain or a tuning voltage of a voltage-controlled oscillator (VCO) in the PLL. For example, the AGC loop 130 might be protected by disconnecting its inputs during the protect mode so that the target amplitude of the MEMS oscillation (as set by gain control output 197, which may be a voltage or code) is preserved. In another example, the PLL 150 might be protected by temporarily preventing it from responding to input clock edges so that the frequency of the output clock 170 is maintained. Once the protect mode is engaged, the drive system 135 and/or the sense system 140 can make a transition between low-power and normal operating modes without creating disturbances to these slow state variables. Removing the protect mode restores normal operation once the transition is complete. By minimizing disturbances to slow system state variables, the overall system can make a rapid transition between operating modes.

An advantage is that systems that might otherwise be difficult to duty-cycle can now operate at lower average power consumption. For example, the drive loop of the MEMS gyroscope system 100 in FIG. 1 may be a high-Q oscillator system whose amplitude is regulated by the AGC loop 130. If the drive loop 120 were to suddenly transition from a low-power mode to a high-power mode, there would be a disturbance that would upset the AGC loop 130 operating state. This disturbed state would be slow to recover due to the low-bandwidth nature of AGC loops for high-Q oscillators. But, by engaging the protect mode during the transition, disturbances to the AGC operating state are substantially eliminated so that the recovery time is minimized.

Figure 1A:
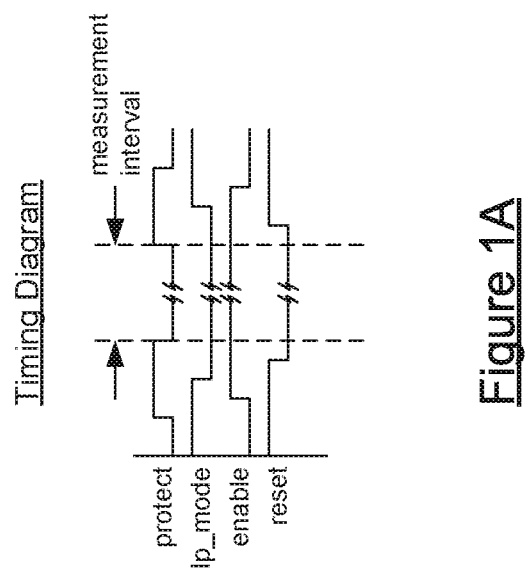
FIG. 1a illustrates a timing diagram of a MEMS gyroscope system.

FIG. 1*a* illustrates a timing diagram to show an exemplary sequence for using a protect mode to minimize transition time between a low-power mode and a normal operating mode. The normal operating mode corresponds to the measurement interval indicated in the timing diagram. During this interval, the gyroscope is fully operational and making measurements of rate of rotation and the full drive and sense systems are active.

Prior to the measurement interval corresponding to normal operating mode, the system is initially in a low-power mode, as indicated by signal Ip_mode being active. The sense path is disabled, as indicated by signal enable being inactive, and the sense path may further be in a reset state, as indicated by signal reset being active. To transition to the normal mode in preparation for the measurement interval, the protect signal is asserted, thereby engaging the protection and preservation of slow system state variables such as those previously mentioned.

While the protect signal is asserted, the low-power mode control signal Ip_mode is de-activated, the sense path is enabled by asserting the enable signal, and subsequently the sense path reset signal is removed, thereby initializing the sense path for proper measurement. Note that the use of a distinct sense path reset signal may be optional in some embodiments if the enable signal accomplishes both enabling and initializing of the sense path. Once the low-power mode is de-activated and the sense path is enabled and initialized, the protect signal is de-activated and the system is in its normal operating mode where measurements may proceed.

A similar sequence of events allows an orderly transition back to the low-power mode. Again referring to FIG. 1*a*, the end of the measurement interval is followed by asserting the protect signal, thereby engaging the protection and preservation of slow system state variables such as those previously mentioned. While the protect signal is asserted, the low-power mode control signal Ip_mode is activated, the sense path is reset, and subsequently the sense path is disabled by de-asserting the enable signal. This puts the system into a low-current state.

After completing the transition to this state, the protect signal is de-asserted. During the low-current state, the AGC and PLL systems may continue to operate, maintaining the system state variables in a state of readiness prior to the onset of the next measurement interval. Thus, by protecting slow system state variables during transitions between normal mode (in which measurements are made) and low-power mode (in which the system is maintained in a state of readiness for pending measurements), the measurement intervals may be rapidly duty-cycled, thereby enabling significant power savings.

FIG. 2 is a flow chart 200 of a method in accordance with an embodiment. The sequence of steps according to method 200 is also illustrated in the timing diagram of FIG. 1. In the method of FIG. 2, first a gyroscope is operated in a low-power mode, via step 202. A protection mode is then enabled to maintain at least one system state variable in a substantially fixed state, via step 204. Next, the gyroscope is transitioned to a normal-power mode, via step 206 by disabling the low-power mode, enabling the sense system and bringing the sense system out of reset.

The protection mode is then disabled, via step 208. Next, a measurement is performed using the gyroscope, via step 210. Thereafter, the protection mode is again enabled to maintain at least one system state variable in a substantially fixed state, via step 212. The gyroscope is transitioned back to the low-power mode, via step 214 by resetting the sense system, enabling the low-power mode, and disabling the sense system. Finally, the protection mode is disabled, via step 216.

In general, one or more system state variables (e.g. an AGC loop gain control output voltage or code or PLL VCO tuning voltage or code) are maintained in a substantially fixed state during the protection mode thereby enabling rapid transitions between low-power and normal operating modes. There may be slow state variables in either the drive or sense systems or both. So, the technique is applicable when duty-cycling either or both systems.

Figure 3:
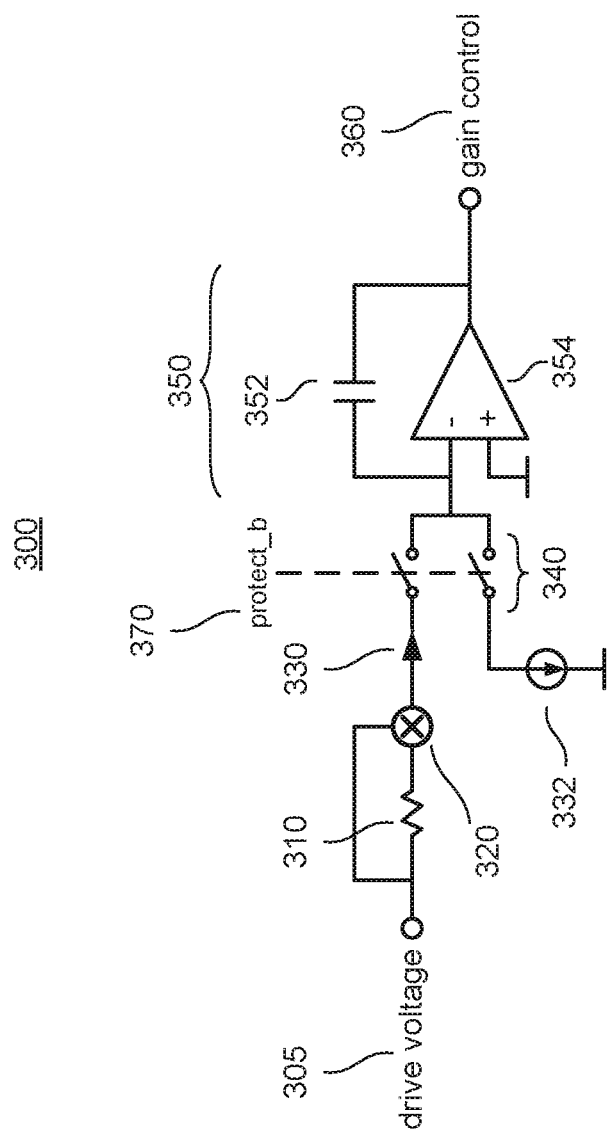
FIG. 3 shows an exemplary AGC system in accordance with an embodiment.

FIG. 3 shows an exemplary means of protecting a system state variable such as an AGC loop gain control voltage in accordance with an embodiment of the present invention. In AGC system 300, a drive-sense voltage 305 representative of an oscillation of the MEMS device is monitored through resistor 310 coupled to the input of rectifier 320. The output of rectifier 320 includes a rectified current 330 whose average value is indicative of the amplitude of oscillation of the MEMS device.

This current flows to the input of the AGC filter 350 operational amplifier 354 through one of the switches 340 where it is compared against a reference current 332. Any difference between the rectified current 330 and the reference current 332 accumulates on capacitor 352 causing an adjustment to the gain control output voltage 360. The gain control output voltage 360 is used by the system in FIG. 1 to adjust the gain of the drive loop 120 via multiplier 136 until a stable amplitude of oscillation is achieved.

The system state variable of interest for this embodiment is the gain control output voltage 360, which is maintained by charge stored on capacitor 352. During a mode transition of the drive loop 120 or AGC loop 130, this charge may be disturbed. Recovery time of gain control output voltage 360 may be slow due to low bandwidth of the AGC system 300. To protect the gain control output voltage 360 during mode transitions, switches 340 may be temporarily disconnected during the protect mode according to signal protect_b 370.

As drawn in FIG. 3, the switches would disconnect current 330 and reference current 332 when signal protect_b 370 is LOW, indicating that the protect mode is active. By disconnecting current 330 and reference current 332 from AGC filter 350, the charge stored on capacitor 352 is protected and preserved, thereby preventing modification of the system state during a transition from low-power mode to normal mode or vice-versa.

Although the example of FIG. 3 shows an analog AGC system, the same principle would apply to a digital AGC system in which the signals involved are digital signals and the AGC loop filter computes the running average of the difference between a signal indicative of an amplitude of oscillation and a reference signal to compute an AGC gain control output code. In such a system, the computation of the running average would be paused during the protect mode to prevent unwanted changes to the running average. The applicability of this technique to various analog, digital or mixed-signal AGC topologies known in the art will be evident to one skilled in the art and will not be described further here.

Figure 4:
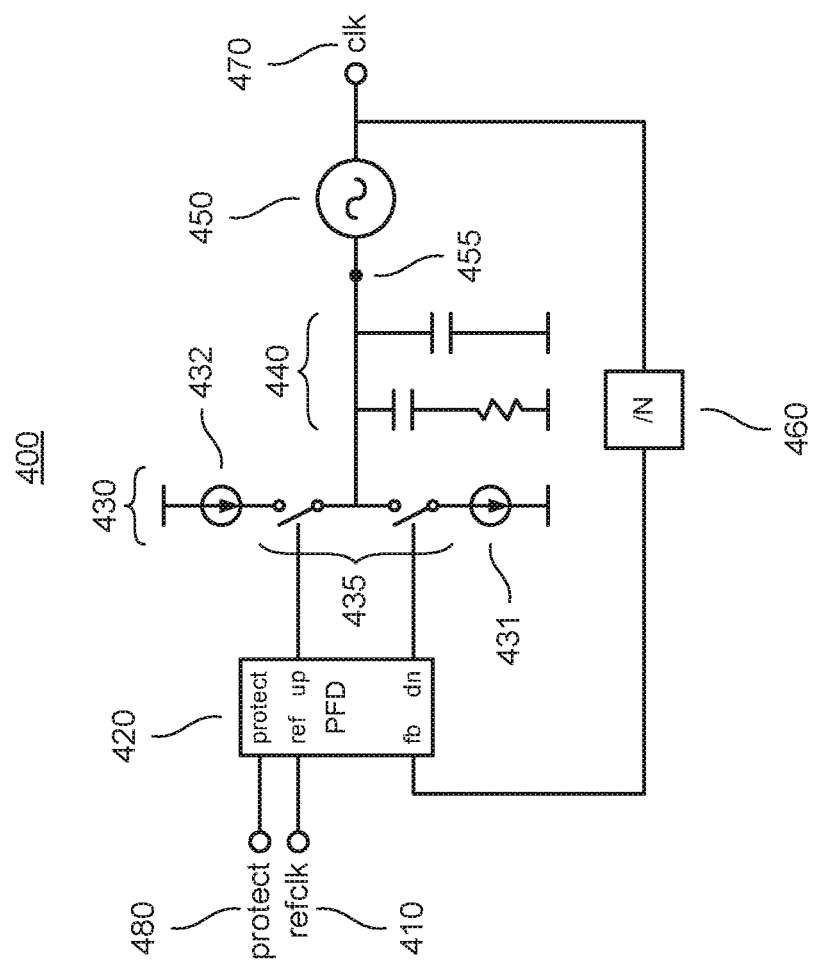
FIG. 4 shows an exemplary PLL system in accordance with an embodiment.

FIG. 4 shows an exemplary means of protecting a system state variable such as a PLL VCO tuning voltage or code in accordance with an embodiment of the present invention. PLL 400 receives a reference clock 410 with a phase-frequency detector (PFD) 420. The PFD 420 compares the phase of the reference clock 410 to that of a feedback clock provided to the PFD 420 by VCO 450 via frequency divider 460. If a phase difference is detected, the tuning voltage 455 of VCO 450 is adjusted by charge pump 430 in response to up/down pulses produced by PFD 420.

The charge pump 430 adjusts the tuning voltage 455 by introducing current pulses from current sources 431-432 via switches 435 according to the up/down pulses from PFD 420. The duration of the up and down pulses gives an indication of the phase difference and the loop works by feedback action to ensure that VCO tuning voltage 455 is adjusted until the reference and feedback clock frequencies and phases substantially match. This condition, in turn, requires that the output clock 470 have a frequency that is N-times larger than the reference clock frequency.

The system state variable of interest in PLL 400 is the VCO tuning voltage 455, which is maintained by loop filter 440. This state variable may be disturbed during system mode transitions and recovery time may be limited by the loop bandwidth of the PLL 400. To avoid disturbance of tuning voltage 455 during a system mode transition, PFD 420 incorporates a protect mode input receiving protect signal 480. When the protect signal is active, the PFD will inhibit operation of switches 435 so that no current can enter or leave loop filter 440, thereby protecting and preserving the VCO tuning voltage 455 during transitions between low-power and normal operating modes of the system.

Although the example of FIG. 4 shows an analog PLL system, the same principle would apply to a digital PLL system in which the signals involved are digital signals and the PLL loop filter computes the running average of the phase difference between reference and feedback clocks to produce a VCO tuning code. In such a system, the computation of the running average would be paused during the protect mode to prevent unwanted changes to the running average. The applicability of this technique to various analog, digital or mixed-signal PLL topologies known in the art will be evident to one skilled in the art and will not be described further here.

The foregoing paragraphs have provided two exemplary subsystems wherein a system state variable (such as AGC gain control output voltage or PLL VCO tuning voltage) is preserved during a protect mode to provide orderly and rapid transitions between a system low-power mode and a system normal operating mode. The technique may be applicable to other subsystems comprising system state variables that are slow to recover from disturbances and would therefore benefit from protection during system power mode transitions. Such applications are within the scope and spirit of the present invention as will be evident to one of ordinary skill in the art.

The foregoing description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

What is claimed is:

1. A gyroscope duty-cycling method comprising:
   operating a gyroscope in a low-power mode;
   enabling a protection mode to maintain at least one system state variable in a substantially fixed state;
   transitioning the gyroscope to a normal-power mode;
   disabling the protection mode;
   performing a measurement using the gyroscope;
   enabling the protection mode to maintain the at least one system state variable in a substantially fixed state;
   transitioning the gyroscope back to the low-power mode; and
   disabling the protection mode.

2. The method of claim 1, wherein the one or more system state variables comprise an automatic gain control (AGC) loop state variable or a Phase-Locked Loop (PLL) state variable.

3. The gyroscope system of claim 2, wherein the AGC loop state variable comprises a gain control output voltage.

4. The gyroscope system of claim 2, wherein the AGC loop state variable comprises a gain control output code.

5. The gyroscope system of claim 2, wherein the PLL state variable comprises a voltage controlled oscillator (VCO) tuning voltage.

6. The gyroscope system of claim 2, wherein the PLL state variable comprises an oscillator tuning code.

7. A method for duty-cycling a gyroscope system comprising:
   enabling a protection mode of the gyroscope system, the protection mode being a mode wherein one or more system state variables are maintained in a substantially fixed state;
   transitioning the gyroscope system between a normal power mode and a low power mode as needed; and
   disabling the protection mode of the gyroscope subsequent to the transitioning.

8. The method of claim 7, wherein once the protection mode is enabled, a drive system and/or a sense system of the gyroscope system makes a transition between the low-power mode and the normal operating mode without creating disturbances to the one or more system state variables.

9. The method of claim 7, wherein the one or more system state variables comprise an automatic gain control (AGC) loop state variable and/or a Phase-Locked Loop (PLL) state variable.

10. The gyroscope system of claim 9, wherein the AGC loop state variable comprises a gain control output voltage.

11. The gyroscope system of claim 9, wherein the AGC loop state variable comprises a gain control output code.

12. The gyroscope system of claim 9, wherein the PLL state variable comprises a voltage controlled oscillator (VCO) tuning voltage.

13. The gyroscope system of claim 9, wherein the PLL state variable comprises an oscillator tuning code.

14. A method comprising:
disabling a sense path of a sense system of a gyroscope to operate the gyroscope in a low-power mode;
enabling a protection mode to maintain a state associated with a slow system state variables;
transitioning the gyroscope to a normal-power mode;
disabling the protection mode;
enabling the sense path of the sense system of the gyroscope; and
performing a measurement using the gyroscope.

15. The method of claim 14 further comprising:
enabling the protection mode to maintain the state associated with a slow system state variables;
transitioning the gyroscope to the low-power mode; and
disabling the protection mode.

16. The method of claim 14, wherein the state is associated with automatic gain control (AGC) loop or tuning voltage of a voltage-controlled oscillator (VCO) of a phase-locked loop (PLL).

17. The method of claim 16, wherein enabling the protection mode comprises:
disconnecting input of the AGC.

18. The method of claim 16, wherein enabling the protection mode comprises:
preventing the PLL from responding to input clock edges.

19. The method of claim 16, wherein enabling the protection mode comprises:
preventing input and output into and out of a loop filter of the PLL.

* * * * *